(12) United States Patent
Izumida et al.

(10) Patent No.: US 7,144,679 B2
(45) Date of Patent: Dec. 5, 2006

(54) POLYIMIDE RESIN PRECURSOR SOLUTION, LAMINATES FOR ELECTRONIC COMPONENTS MADE BY USING THE SOLUTION AND PROCESS FOR PRODUCTION OF THE LAMINATES

(75) Inventors: Shinya Izumida, Otsu (JP); Koji Itoh, Otsu (JP); Minoru Oyama, Chigasaki (JP); Atsushi Suzuki, Kawagoe (JP)

(73) Assignee: Toray Engineering Company, Limited, Osaka (JP)

( * ) Notice: Subject to any disclaimer, the term of this patent is extended or adjusted under 35 U.S.C. 154(b) by 149 days.

(21) Appl. No.: 10/450,048

(22) PCT Filed: Dec. 28, 2001

(86) PCT No.: PCT/JP01/11613

§ 371 (c)(1),
(2), (4) Date: Jun. 10, 2003

(87) PCT Pub. No.: WO02/059209

PCT Pub. Date: Aug. 1, 2002

(65) Prior Publication Data

US 2004/0018131 A1 Jan. 29, 2004

(30) Foreign Application Priority Data

Jan. 24, 2001 (JP) ............................. 2001-016339

(51) Int. Cl.
G03C 1/725 (2006.01)
G03C 1/735 (2006.01)
G03C 1/74 (2006.01)
C08F 2/46 (2006.01)

(52) U.S. Cl. .................. 430/283.1; 430/280.1; 522/150; 522/152; 522/162; 522/164; 522/176; 522/170; 427/517; 427/403; 427/404; 427/508; 427/407.1; 427/418; 427/419.1

(58) Field of Classification Search ................ 522/134, 522/150, 152, 162, 164, 170, 176; 430/207.1, 430/280.1, 280, 286.1, 287.1, 288.1, 283.1; 427/508, 517, 403, 404, 407.1, 418, 419.1
See application file for complete search history.

(56) References Cited

U.S. PATENT DOCUMENTS 5,032,488 A * 7/1991 Finter ..................... 430/270.1
5,175,399 A 12/1992 Mori
5,916,632 A * 6/1999 Mishina et al. ............ 427/240

FOREIGN PATENT DOCUMENTS

| JP | 60-097506 A1 | 5/1985 |
|---|---|---|
| JP | 62-192584 A1 | 8/1987 |
| JP | 03-208393 A1 | 9/1991 |
| JP | 05-306469 A1 | 11/1993 |
| JP | 07-070762 A1 | 3/1995 |
| JP | 07-216225 A1 | 8/1995 |
| JP | 2001-073159 A1 | 3/2001 |

OTHER PUBLICATIONS

International Search Report for PCT/JP01/11613 mailed on Feb. 12, 2002.

* cited by examiner

*Primary Examiner*—Sanza L. McClendon
(74) *Attorney, Agent, or Firm*—Rader, Fishman & Grauer PLLC (57) ABSTRACT

Laminates for electronic components are produced by applying a polyimide resin precursor solution containing a palladium compound on a polyimide substrate, drying the resulting coating to form a polyimide resin precursor layer, irradiating this layer with ultraviolet rays in the presence of a hydrogen donor to form nuclei for primer plating, forming a metal primer layer by electroless plating, and converting the polyimide resin precursor layer into a polyimide resin layer through imidation by heating either after or before the formation of a surface plating layer. The invention provides laminates for electronic components which are extremely improved in adhesion to metal layers without impairing the characteristics inherent in the substrate and are excellent in insulating properties, and polyimide resin precursor resin solution to be used in the production of the laminates.

4 Claims, 5 Drawing Sheets

Fig.5

POLYIMIDE RESIN PRECURSOR SOLUTION, LAMINATES FOR ELECTRONIC COMPONENTS MADE BY USING THE SOLUTION AND PROCESS FOR PRODUCTION OF THE LAMINATES

FIELD OF THE INVENTION

The present invention concerns a process for production of electronic component materials and laminates for micro processing having a polyimide resin layer.

BACKGROUND ART

A copper clad polyimide substrate is used as flexible printed board, TAB material or CSP material; however, along with the miniaturization of the hardware and the speeding up of signal transfer rate, micro processing such as high density micro wiring or micro via becomes necessary, more requiring materials having a higher adhesion strength of the metal film.

In the prior art, in order to obtain a copper clad polyimide substrate having a higher adhesion strength, a process in which the polyimide surface is submitted to a dry pretreatment such as ion bombard, corona discharge before deposition a primer metal such as nickel or chromium by a spatter and electroless plating and electrolytic plating are executed thereon to form a metal film has been adopted.

However, this process requires an expensive equipment for performing pretreatment or spattering in the vacuum, lowers the production volume, and increases the cost, and it is difficult to say this process is industrially advantageous.

On the other hand, in case of producing a copper clad polyimide by imparting catalyst and executing electroless plating or electrolytic plating, without dry pretreatment nor spatter treatment, an expensive equipment is unnecessary, but there is a problem that the adhesion strength between metal and polyimide is so low that it is practically unusable.

As a means for forming a metal layer on the laminates surface, there is a process using palladium chloride catalyst taking stannous chloride as a reductant, and recently, a process for absorbing palladium catalyst by the reaction between a zinc oxide film and palladium oxide and reducing by a reductant, or a process for reducing metal(Pd) ions, by irradiating zinc oxide (photo semiconductor) with light, in order to form a metal layer on the surface of glass or ceramics, are reported in "Electronics Packaging Technology (VOL. 11, No. 6, P32, 1995)"; however, this process could not be applied to organic materials, because it is restricted to inorganic materials such as glass, ceramics on which zinc oxide thin film can be formed easily and adheres strongly.

Moreover, a process for alkali hydrolyzing the surface of a polyimide film to make polyamide acid, then absorbing copper or palladium ion by reacting with copper sulfate or palladium chloride and, thereafter, irradiating with ultraviolet of a low pressure mercury lamp using sodium formate as a reductant (The 13th Electronics Packaging Society Lecture Book P183, 1999) has been reported; however, it takes extremely long for forming catalyst nuclei by ultraviolet irradiation, and moreover, there was a problem that the decomposition of the reductant generates NaOH, which is alkaline and deteriorates the polyimide film.

Furthermore, as any of the aforementioned processes is a process for forming a metal layer only on the surface of laminates, it is impossible to obtain a so-called anchor effect where the metal layer penetrates into the laminates.

There, it has been proposed a process for forming a coating by melting a salt of rear metal on the surface of an object to be plated before reducing with a reducing gas such as hydrogen, CO, $H_2S$ (the Japanese Patent No. 1993-61296) or a process for combining a metal compound reduced only by contact with it and a metal compound that can be reduced directly by a reductant (the Japanese Patent Laid-Open No.1993-306469).

However, the process described in the Japanese Patent No. 1993-61296 provokes problems of the safety such as explosion and toxicity of reducing gas, while the process described in the Japanese Patent Laid-Open No. 1993-306469 has provoked loss of resin characteristics (strength, insulation and so on) because an addition amount of metal compound is necessary so large as about 200 weight parts per 100 weight parts of resin, and problems of insulation because not completely reduced metal compound remains in the resin, inducing easily metal ion migration and so on.

The present invention intends to provides laminates for electronic components of an extremely high adhesion strength with metal layers, without using an expensive equipment and of high insulating properties, without impairing characteristics inherent in the substrate, a cheap process for production of the laminates for electric components, and a polyimide resin precursor solution for using for the production of the same.

DISCLOSURE OF THE INVENTION

The polyimide resin precursor solution in the present invention is characterized by that palladium compound is dispersed uniformly in the polyimide resin precursor, and moreover, the palladium compound and the polyimide resin precursor form a complex.

For the formation of a homogeneous polyimide resin precursor layer, it is preferable to use a polyimide resin precursor varnish composed of at least one spices of polyamic acid or derivatives of polyamic acid as a polyimide resin precursor and to use a palladium acetylacetone complex or a palladium organic acid salt as a palladium compound.

Besides, the laminates for electronic components in the present invention are characterized by having a polyimide resin layer formed by using a polyimide resin precursor solution between the polyimide substrate and the surface plating layer, in laminates for electronic components forming a surface plating layer on a polyimide substrate.

Moreover, the process of production of laminates for electronic components in the present invention comprises steps of, applying and drying a polyimide resin precursor solution containing a palladium compound on a polyamide substrate to form a polyimide resin precursor layer, then irradiating with ultraviolet rays in the presence of a hydrogen donor to form nuclei for primer plating, and thereafter, forming a plating metal primer layer by electroless plating and further converting the polyimide resin precursor layer into a polyimide resin layer through imidation by heating it either after or before the formation of a surface plating player.

It is preferable to use water, alcohol or alcohol aqueous solution as a hydrogen donor, because palladium ion of the palladium complex by the ultraviolet irradiation in presence of hydrogen donor can be reduced to the palladium metal efficiently and stably.

BEST MODE FOR CARRYING OUT THE INVENTION

Figure 1:
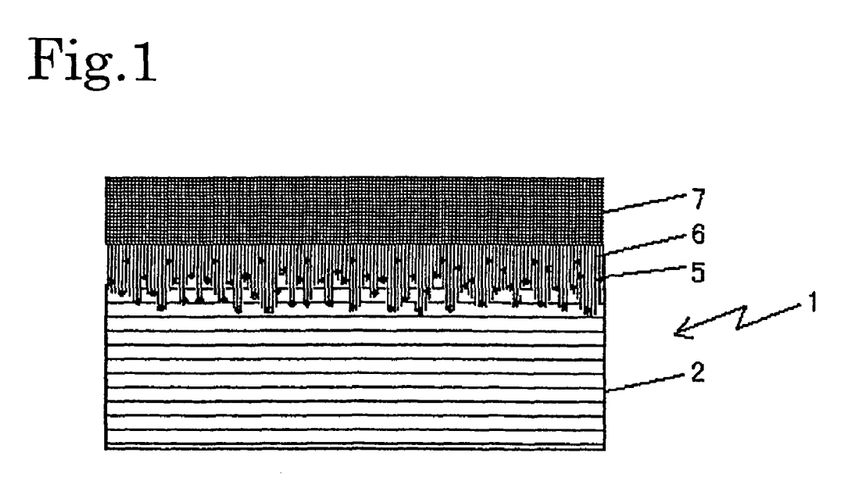
FIG. 1 is a sectional view of laminates for electronic components of the present invention.

Laminates 1 for electronic components according to the embodiments of the present invention, as shown in FIG. 1, have a structure in which a part of a plating metal primer layer 6 existing between a polyimide substrate 2 and a surface plating layer 7 is enveloped in a polyimide resin layer newly formed on the polyimide substrate 2 using a polyimide resin precursor solution.

Figure 2:
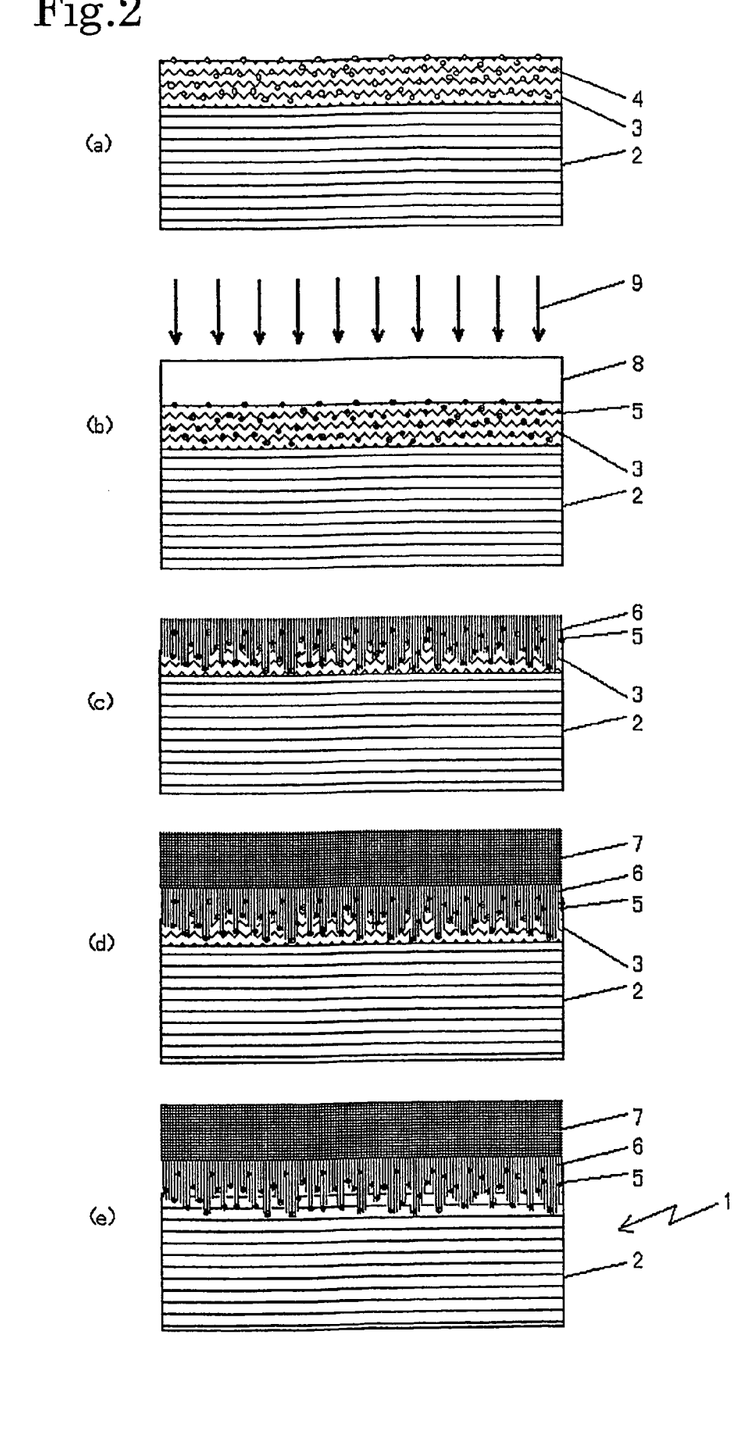
FIG. 2 is a drawing showing sectionally a process for production of the laminates for electronic components of the present invention in the order of steps, (a) is a sectional view showing a state where a polyimide resin precursor layer is formed on a polyimide substrate, (b) a sectional view showing a state where nuclei for primer plating is formed by irradiating with ultraviolet rays in the presence of a hydrogen donor, (c) a sectional view showing a state where a metal primer layer is formed by electroless plating, (d) a sectional view showing a state where a surface plating layer is formed, and (e) a sectional view showing a state where the polyimide resin precursor layer is converted into a polyimide resin layer through imidation by heating.

A process for production of the laminates for electronic components in this embodiment consists in forming the laminates 1 for electronic components, as shown in FIG. 2, by applying and drying a polyimide resin precursor solution containing a palladium compound 4 on the polyamide substrate 2 to form a polyimide resin precursor layer 3 (FIG. 2(a)), then irradiating with ultraviolet rays 9 in the presence of a hydrogen donor 8 and reducing palladium ion in the palladium compound 4 into palladium metal to form nucleus 5 for primer plating (FIG. 2(b)), forming the plating metal primer layer 6 by electroless plating (FIG. 2(c)), further forming the surface plating layer 7 (FIG. 2(d)), and thereafter, converting the polyimide resin precursor layer into a polyimide resin layer through imidation by heating (FIG. 2(e)).

As the result of measurement of the adhesion strength between the metal layer and the polyimide resin layer of thus obtained laminates for electronic components (electrolyte copper plating thickness 25 μm) by JISC-6481, the peel strength was 11 to 14 N/cm (1100 to 1400 gf/cm), which was equal or superior the peel strength of the laminates for electronic components produced by a process of spatter/electroless plating/electrolytic plating of the prior art.

The polyimide substrate used in the present invention includes non thermoplastic polyimide resin and thermoplastic polyimide and, for instance, polyimide comprised of commercial pyromellitic anhydride (PMDA) and oxydianiline (ODA), polyimide comprised of biphenyl tetracarboxylic acid anhydride (BTDA) and p-phenylenediamine (PDA) and copolymer of these monomers, thermoplastic polyimide comprised of aromatic tetracarboxylic acid anhydride and aromatic diamine and so on having —O—, —CO—, —Si— or other flex groups in the molecular, and furthermore, solvent soluble thermoplastic polyimide such as copolymer with cycloaliphatic carboxylic acid anhydride and so on can be cited, and these polyimide substrates are used mainly as film-like substrate in the domain of electronic components.

As for polyimide resin precursor, polyamic acid varnish obtained from the same monomer components as the polyimide resin or polyaimic acid varnish containing a photosensitive group in the molecular are used. For instance, "Torayneece" varnish, "Photoneece" varnish made by Toray Industries, Inc., "U-Varnish" of Ube Industries, Inc., and so on can be cited, and mixture of polyimide resin precursor varnish and solvent soluble polyimide varnish may also be used.

Solvent soluble polyimide varnish includes thermoplastic polyimide varnish "SPI-200N" made by Nippon Steel Chemical Co., Ltd.

Palladium compound includes various salts of palladium or organic carbonyl complex, and as for salts of palladium, hydrochloride, sulfate salt, acetate, oxalate, citrate and so on can be cited. In addition, as for organic carbonyl compound, β-diketones such as acetylacetone, dibenzoyl methane, or β-keto carboxylic ester such as acetacetic ester can be cited. Especially, organic salts and complex compounds such as palladium acetate or acetylacetone complex are used preferably as they are easily available, excellent in solubility into to the organic solvent and in thermal stability, and inorganic ions such as chlorine ion do not remain in the resin after photo reaction.

The organic carbonyl complex is solved in n-methyl 2-pyrrolidinone (NMP) or NN'-dimethylacetamide (DMAc) which are solvent of polyimide resin precursor, then blended and solved uniformly in the polyimide resin precursor varnish, applied as a thin film layer on the polyimide substrate using, for instance, spin coater, bar coater or, furthermore, screen printing or the like, and dried at a temperature not more than the thermal decomposition temperature of organic carbonyl complex, normally not more than 150° C.

The film thickness of the polyimide resin precursor layer after drying is normally 0.1 to 10 μm, and the complex concentration in the polyimide resin precursor layer is different according to the kind of complex and, for instance, in case of palladium acetylacetone complex or palladium acetate, the order of 0.1 to 10 weight % is desirable and in case of palladium chloride, the order of 1 to 5 weight % is preferable.

Screen printing method is preferable for direct wiring or formation of connection bump or the like on the polyimide substrate without passing through steps of photolitho or others.

It is obvious that a polymer complex is formed by the reaction between a polyimide resin precursor and a palladium compound from viscosity elevation or gel formation at the time when the palladium compound is added to the polyimide resin precursor as described in the embodiment 12 to the embodiment 14 below.

Figure 3:
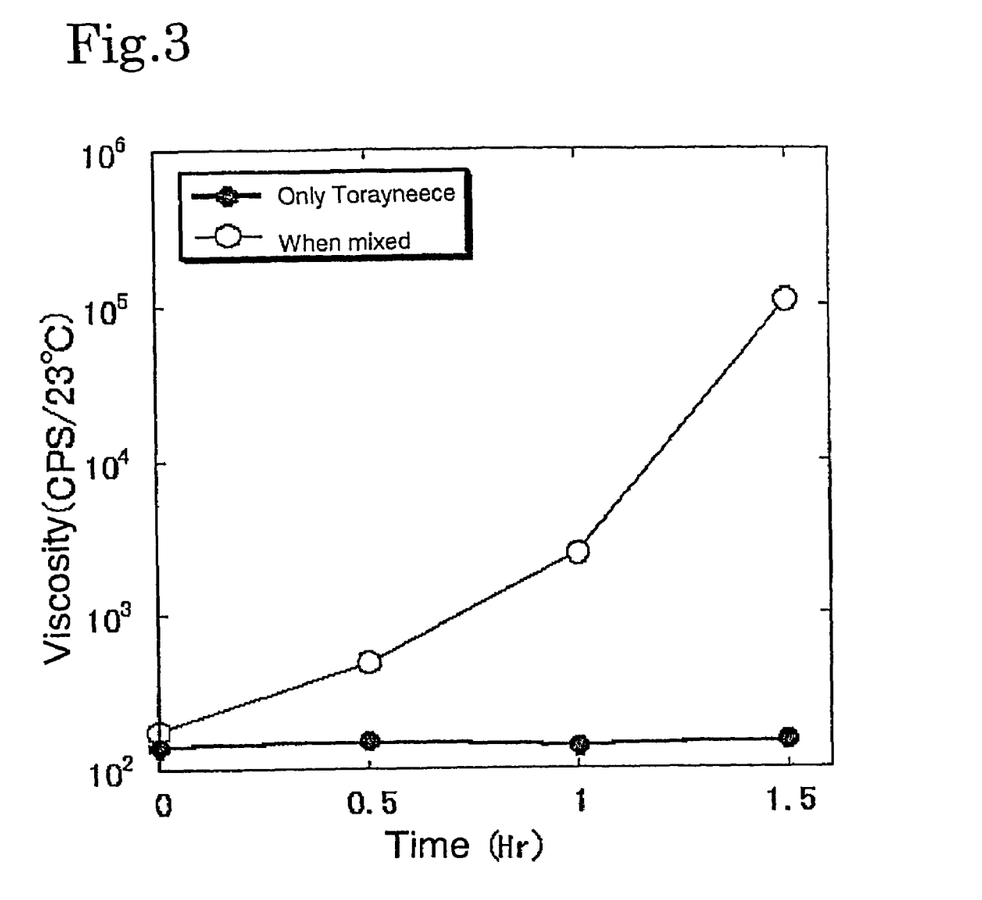
FIG. 3 is a drawing showing a viscosity variation in case of adding palladium acetylacetone complex to the polyimide resin precursor solution and viscosity variation of the polyimide resin precursor solution.

As described in the embodiment 12 below, FIG. 3 shows the viscosity variation in case of adding palladium acetylacetone complex to the polyimide resin precursor solution and the viscosity variation of the polyimide resin precursor solution.

The same trend can also be observed in case of adding palladium acetate or palladium chloride in place of palladium acetylacetone complex. However, as described in the comparative example 8 below, solution viscosity variation or gelation phenomenon never occur in case of adding copper (II) acetylacetone in place of palladium acetylacetone complex.

Consequently, the formation of polymer complex by the reaction between a polyimide resin precursor and a palladium compound is specific to the palladium ion, and it is supposed that the palladium ion reacts with a functional group of the polyimide resin precursor, a complex in which a palladium ion is coordinated in the polymer molecular, and is in a state being incorporated as one component.

In short, in a polyimide resin precursor layer formed on the polyimide substrate surface by application and drying, it is supposed that not only palladium ion is distributed uniformly, but also distributed in a way to be exposed on the surface as one component of the polymer molecular existing on the polyimide resin precursor layer surface.

In fact, as described in the embodiment 1 below, from the XPS measurement results of the polyimide resin precursor layer surface shown in FIG. 4 and the Auger spectrum measurement results shown in FIG. 5, it has been confirmed that these palladium complexes exist uniformly on the polyimide resin layer surface and in the depth direction of the resin layer.

As for ultraviolet rays to be used in the present invention, UV not more than 450 nm in wavelength radiated from a mercury UV lamp or an UV laser generator can be used, UV not more than 370 nm is effective and UV of 254 nm is particularly effective. Concerning the UV lamp, a commercialized low pressure UV lamp is used preferentially.

Figure 4:
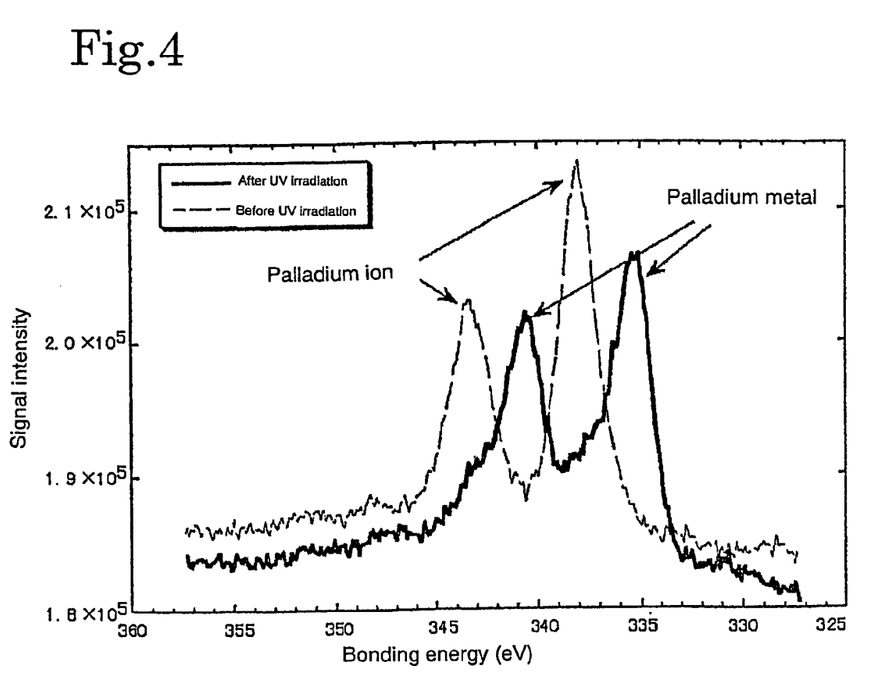
FIG. 4 is a drawing showing the XPS analysis results showing the binding energy of palladium of the polyimide resin precursor thin film before and after the ultraviolet irradiation.
Figure 5:
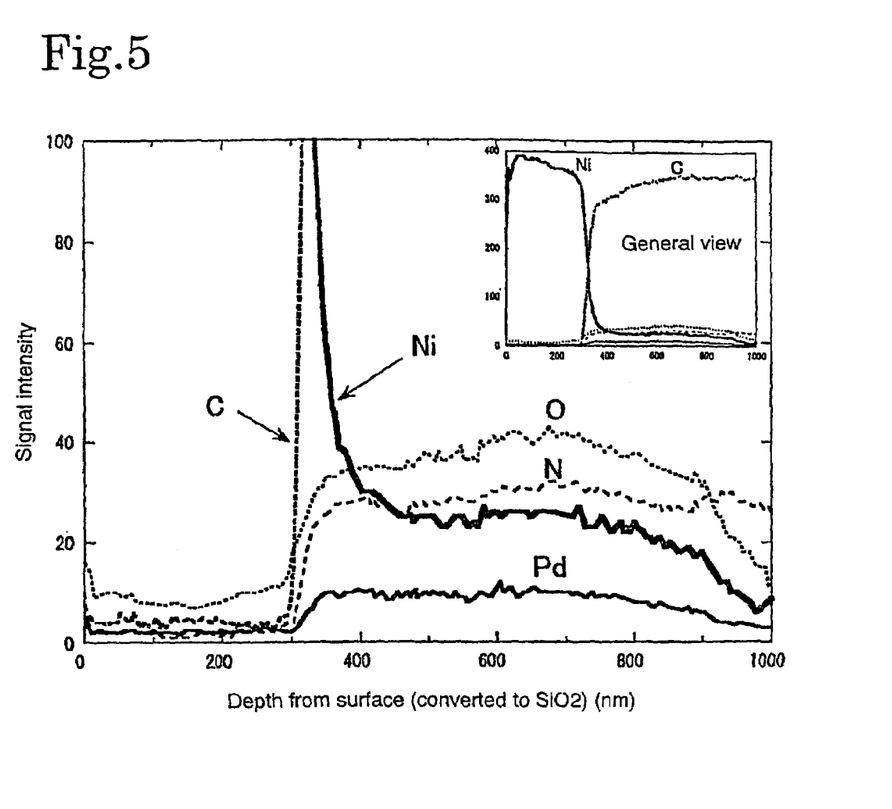
FIG. 5 is an Auger analysis chart diagram in the dept direction of a nickel plating metal primer layer after electroless nickel plating and the polyimide resin precursor thin film.

It can be understood that palladium ion has been reduced to palladium metal from the XPS measurement results of the polyimide resin precursor layer surface shown in FIG. 4.

In short, when irradiated with UV, the palladium polymer complex compound is excited by absorbing light, the palladium ion in the excited complex molecular is reduced to the palladium metal in the presence of hydrogen donor to form nuclei for primer plating.

Sensitizer can be added in order to accelerate photo reaction of the complex compound, provided there is no particular bad effect on the adhesion between metal and polyimide and so on.

The hydrogen donor includes water, alcohol and furthermore alcohol aqueous solution and so on and, particularly, the alcohol aqueous solution presenting less UV absorption in the aforementioned UV wavelength range and a well-moderated wettability with the polyimide resin precursor layer surface is used preferentially. It should be appreciated that since the reaction reducing metal ion to metal is inhibited by the presence of oxygen, it is preferable to block air (oxygen) during the UV irradiation. Usually, the polyimide substrate is irradiated in a state immerged in the hydrogen donor; however, in case where the hydrogen donor is water, besides the irradiation all the way supplying moisture from the exterior by the submerged irradiation or the like, it is also possible to use by making the polyimide resin precursor layer absorb sufficient moisture beforehand.

The UV irradiation time is different according to the UV irradiation intensity, and the normal irradiation time is on the order of 1 min to 20 min in case of UV irradiation from an UV lamp, while the normal irradiation time is not more than 60 sec in case of UV irradiation from a laser generator. UV irradiation quantity is on the order of 500 to 15000 mJ/cm$^2$ in case of measurement by illuminance meter UV-02 made by ORC Manufacturing Co., Ltd. and, particularly, the order of 1500 to 9000 mJ/cm$^2$ is preferable. An excessive irradiation quantity is not preferable as the polymer itself may be damaged and so on.

The polyimide substrate having the polyimide resin precursor layer irradiated with ultraviolet is subjected to electroless plating using nuclei for primer plating as catalyst to form a plating metal primer layer before being subjected metal plating until a necessary metal film thickness is obtained by electroless copper plating or electrolytic copper plating or the like, and after washing with water and drying, imidated through heating up to 400° C. in the nitrogen atmosphere. It should be appreciated that the imidation through heating can be performed in any phase before and after the electrolytic plating, provided after formation of metal primer layer by the electroless plating.

The electroless plating bath for the formation of metal primer layer is not particularly restricted; however, considering the barrier property against metal ion and the chemical resistance (alkali resistance) of the polyimide resin precursor, usually, neutral to weakly acid hypophosphorous salt type or dimethylaminoborane type nickel plating bath is used preferentially. Besides, normal electrolytic copper plating or electrolytic nickel plating bath can be used for electrolytic plating bath.

A wiring of L/S=100/100 (μm) was prepared by photo-litho etching method, using the laminates for electronic components (electrolytic copper plating thickness 18 μm) obtained by the aforementioned process, polyimide resin precursor layer of the portion other than wiring is removed by etching and, thereafter, the line-to-line insulation resistance was measured by JISC-5016 to obtain such a high insulation resistance as $1.5 \times 10^{12}$ Ω·cm.

The laminates for electronic components obtained by the present invention in which nuclei for primer plating exist in the polyimide resin are extremely improved in adhesion strength between the plating metal primer layer and the polyimide resin because of the anchor effect thereof. Moreover, they are excellent in insulating properties between wires after formation of wiring, and can be used sufficiently as electronic component materials for micro processing.

Now, the present invention shall be described more in detail referring to embodiments and comparative examples.

Embodiment 1

A solution in which commercialized palladium acetylacetone complex (abbreviated as a palladium complex, hereinafter) was dissolved in n-methyl 2-pyrrolidinone (abbreviated as an NMP, hereinafter) was added into a polyimide resin precursor varnish "Torayneece" #3000 made by Toray Industries, Inc., and the varnish solution was adjusted so that the palladium complex content per varnish solution would be 1 wt/vol %. The vanish solution contains approximately 5 wt % of palladium complex per polyimide resin precursor.

It should be appreciated that 1 wt/vol % means, for instance, the concentration of dissolution of palladium complex 0.01 g in "Torayneece" varnish solution 1 ml.

Then, a test piece 10×10 cm (thickness 50 μm) of polyimide substrate "UPILEX-S" made by Ube Industries, Inc. was treated with 1% NaOH aqueous solution and 1% HCl aqueous solution, washed with pure water, and dried, before applying the varnish solution with a bar coater and drying at the room temperature and 120° C., to obtain a substrate of about 5 μm in coating thickness. The results of XPS analysis of the substrate surface are as shown in FIG. 4 and the existence of palladium on the surface was observed.

Water was dropped on the substrate and in a state sandwiched between quartz boards for forming a water film, it was irradiated with ultraviolet rays for 3 min by a low pressure mercury lamp. UV irradiation quantity, as the results of measurement by an illuminance meter "UV-02" made by ORC Manufacturing Co., Ltd., was 4500 mJ/cm$^2$. From the results of XPS analysis of the substrate surface as shown in FIG. 4, it can be understood that palladium metal was detected and palladium ion was reduced to palladium metal.

Next, the UV irradiated substrate was immerged for 5 min in an electroless nickel plating bath Enplate Ni-426"(PH=6 to 7) using hypophosphorous soda made by Meltex Inc. heated to 65° C. as a reductant, to obtain a substrate in which a plating layer having an uniform and metallic gross in the UV irradiated part. The substrate was washed with water and dried to obtain a plating primer layer. The results of Auger spectrum measurement of the nickel plating portion and the polyimide resin precursor layer of the obtained substrate are shown in FIG. 4 and nickel was detected up to the depth of the polyimide resin precursor layer.

Furthermore, an electrolytic plating was performed with a current density of 3.3 A/dm$^2$ in an electrolytic copper plating bath, to obtain a copper coated polyimide substrate of 24 μm in copper film thickness.

The substrate was dried at 150° C. in the nitrogen atmosphere before heating furthermore to 400° C., held at 400° C. for 15 min for imidation of polyimide resin precursor layer and, thereafter, refrigerated to 20° C.

The peel strength between the metal portion and the polyimide resin layer of the obtained substrate was measured through a method defined by JISC-6481 to obtain 14N/cm (1400 gf/cm).

Embodiment 2

The content of palladium complex in the polyimide resin precursor solution of the Embodiment 1 was modified to 0.5 wt/vol % to perform the same treatment, obtaining laminates for electronic components of 22 μm in copper film thickness. The peel strength between the metal portion and the polyimide resin layer of the obtained substrate was measured through the method defined by JISC-6481 to obtain 12N/cm (1200 gf/cm).

Embodiment 3

The UV irradiation quantity of the Embodiment 1 was modified to 7500 mJ/cm$^2$ to perform the same treatment.

Embodiment 4

The UV irradiation quantity of the Embodiment 1 was modified to 9000 mJ/cm$^2$ to perform the same treatment.

Embodiment 5

The content of palladium complex in the polyimide resin precursor solution of the Embodiment 1 was modified to 0.5 wt/vol % and the UV irradiation quantity of the Embodiment 1 was modified to 7500 mJ/cm$^2$ to perform the same treatment.

Embodiment 6

The content of palladium complex in the polyimide resin precursor solution of the Embodiment 1 was modified to 0.5 wt/vol % and the UV irradiation quantity of the Embodiment 1 was modified to 9000 mJ/cm$^2$ to perform the same treatment.

Copper film thickness and peel strength of Embodiment 1 to 6 are shown in Table 1.

TABLE 1

| Embt No. | Pd complex content wt/vol % | UV irradiation mJ/cm$^2$ | Cu thickness μm | Peel strength N/cm |
|---|---|---|---|---|
| 1 | 1.0 | 4500 | 24 | 14 |
| 2 | 0.5 | 4500 | 22 | 12 |
| 3 | 1.0 | 7500 | 24 | 14 |
| 4 | 1.0 | 9000 | 24 | 13.5 |
| 5 | 0.5 | 7500 | 20 | 11 |
| 6 | 0.5 | 9000 | 20 | 11.5 |

Embodiment 7

A solution in which commercialized palladium acetate was dissolved in NMP was added into polyimide resin precursor varnish "Torayneece" #3000 made by Toray Industries, Inc., and the varnish solution was adjusted so that the content of palladium acetate would be 1wt/vol %.

Then, a test piece 10×10 cm (thickness 50 μm) of polyimide substrate "UPILEX-S" made by Ube Industries, Inc. was treated with 1% NaOH aqueous solution and 1% HCl aqueous solution, washed with pure water and dried before applying the varnish solution and drying at 120° C., to obtain a substrate of about 4 μm in coating thickness.

Twenty % ethanol aqueous solution was dropped on the substrate and in a state sandwiched between quartz boards for forming an ethanol aqueous solution film, it was irradiated with ultraviolet rays for 3 min by a low pressure mercury lamp.

Thereafter, the same treatment as the Embodiment 1 was performed.

Embodiment 8

The content of palladium acetate of the Embodiment 7 was modified to 0.5 wt/vol % to perform the same treatment.

Copper film thickness and peel strength of Embodiment 7 and 8 are shown in Table 2.

TABLE 2

| Embt No. | Pd acetate content wt/vol % | UV irradiation mJ/cm$^2$ | Cu thickness μm | Peel strength N/cm |
|---|---|---|---|---|
| 7 | 1.0 | 4500 | 24 | 14 |
| 8 | 0.5 | 4500 | 24 | 13.5 |

Embodiment 9

The polyimide substrate "UPILEX-S" made by Ube Industries, Inc. of the Embodiment 1 was substituted with a polyimide film "Kapton® EN" made by DuPont-Toray Co., Ltd. to perform a similar treatment. Copper film thickness and peel strength of the obtained laminates for electronic components are shown in Table 3.

TABLE 3

| Embt No. | Pd complex content wt/vol % | UV irradiation mJ/cm$^2$ | Cu thickness μm | Peel strength N/cm |
|---|---|---|---|---|
| 9 | 1.0 | 4500 | 23 | 13.5 |

Embodiment 10

Polyimide resin precursor varnish "Torayneece" made by Toray Industries of the Embodiment 1 was mixed with the same quantity of thermoplastic polyimide varnish "SPI-200N" made by Nippon Steel Chemical Co., Ltd., and NMP solution of palladium complex was added to the mixture and the varnish solution was adjusted so that the content of palladium acetate would be 1wt/vol %.

Then, the varnish solution was applied to the polyimide substrate "Kapton® EN" made by DuPont-Toray Co., Ltd. washed with pure water, and dried at 120° C., to obtain a substrate having a thin film layer of 3 μm in thickness comprised of polyimide resin precursor and thermoplastic polyimide.

Twenty % ethanol aqueous solution was dropped on the substrate and in a state sandwiched between quartz boards for forming an ethanol aqueous solution film, it was irradiated for 3 min with ultraviolet rays by a low pressure mercury lamp. UV irradiation quantity, as the results of measurement by an illuminance meter "UV-02" made by ORC Manufacturing Co., Ltd., was 7500 mJ/cm$^2$.

Thereafter, the same treatment as the Embodiment 1 was performed. Copper film thickness and peel strength of the obtained laminates for electronic components are shown in Table 4.

TABLE 4

| Embt No. | Pd complex content wt/vol % | UV irradiation mJ/cm$^2$ | Cu thickness μm | Peel strength N/cm |
|---|---|---|---|---|
| 10 | 1.0 | 7500 | 20 | 11.5 |

Embodiment 11

A solution in which commercialized palladium chloride 5% aqueous solution was dissolved in NMP was added into polyimide resin precursor varnish "Torayneece" #3000 made by Toray Industries, and adjusted so that the content of palladium chloride would be 1wt/vol %. As addition portions gelatinize when the solution was added, more NMP medium was added, heated to 80° C. and agitated for about 1 hour until the concentration became uniform.

Thereafter, the same treatment as the Embodiment 1 was performed. Copper film thickness and peel strength of the obtained laminates for electronic components are shown in Table 5.

TABLE 5

| Embt No. | Pd chloride content wt/vol % | UV irradiation mJ/cm$^2$ | Cu thickness μm | Peel strength N/cm |
|---|---|---|---|---|
| 11 | 1.0 | 4500 | 20 | 11 |

Embodiment 12

NMP (2 g) was mixed with polyimide resin precursor varnish "Torayneece" #3000 (1 g) made by Toray Industries and palladium acetylacetone complex, and the viscosity change of the solution was examined. As the result, as shown in FIG. 3, a large change in the solution state was not observed between after 30 min and just after mixing, but thereafter the viscosity has increased suddenly, confirming the formation of polymer complex.

A test piece 10×10 cm (thickness 50 μm) of polyimide substrate "UPILEX-S" made by Ube Industries, Inc. was treated with 1% NaOH aqueous solution and 1% HCl aqueous solution, washed with pure water, and dried before applying the mixture solution of "Torayneece" varnish and palladium acetylacetone complex and drying at 120° C., then irradiated with ultraviolet rays (7500 mJ/cm2) by a low pressure mercury lamp in a state where air was blocked by a water film, and immerged in an electroless nickel plating bath "Enplate Ni-426"(PH=6 to 7) using hypophosphorous soda made by Meltex Inc. and heated to 65° C. as a reductant, and the results thereof are shown in Table 6.

In this table, the concentration means the concentration % of palladium acetylacetone complex per vanish solution and the dissolution quantity is the dissolution quantity of palladium acetylacetone complex. Also, the solubility is the quantity of NMP necessary for dissolving by heating to 80° C. and adding NMP so as to be able to be applied to the polyimide substrate, in case of gelatinization of the solution.

TABLE 6

| Concentration (%) | Dissolution quantity (g) | NMP quantity (g) | Solution state | Solubility | Plating ability |
|---|---|---|---|---|---|
| 1.0 | 0.01 | 2.0 | Gel state | Dissolved with 12 g | ○ |
| 0.5 | 0.005 | 2.0 | Jelly state | Dissolved with 6 g | ○ |
| 0.1 | 0.001 | 2.0 | Viscosity elevation | Addition unnecessary | ○ |

Here, ○ in the plating ability means that nickel plating was formed satisfactorily (regularly and uniformly) all over the surface of a sample in 10 to 15 min.

Embodiment 13

NMP (2 g) was mixed with the varnish solution (1 g) and palladium acetate, and the viscosity change of the solution was examined similarly to Embodiment 12 and the results thereof are shown in Table 7. It should be appreciated that a large change in the solution state was not observed between after 1 hour and just after mixing, but thereafter the viscosity has increased suddenly. This means that polymer complex was formed.

In this table, the concentration means the concentration % of palladium acetate per vanish and the dissolution quantity is the dissolution quantity of palladium acetate. Also, the solubility is the quantity of NMP necessary for dissolving by heating to 80° C. and adding NMP so as to be able to be applied to the polyimide substrate, in case of gelatinization of the solution.

TABLE 7

| Concentration (%) | Dissolution quantity (g) | NMP quantity (g) | Solution state | Solubility | Plating ability |
|---|---|---|---|---|---|
| 1.0 | 0.01 | 2.0 | Gel state | Dissolved with 12 g | ○ |
| 0.5 | 0.005 | 2.0 | Jelly state | Dissolved with 6 g | ○ |
| 0.1 | 0.001 | 2.0 | Viscosity elevation | Addition unnecessary | ○ |

Embodiment 14

Varnish solution (1 g) was mixed with 5% palladium chloride aqueous solution, and the viscosity change of the solution was examined similarly to Embodiment 12 and the results thereof are shown in Table 8. It should be appreciated that aggregation means a sudden gelatinization, after the mixture of varnish solution and 5% palladium chloride aqueous solution. Such change of state confirms that the viscosity has increased suddenly and polymer complex was formed.

In this table, the concentration means the concentration % of palladium chloride per vanish solution and the dissolution quantity is the dissolution quantity of palladium chloride. Also, the solubility is the quantity of NMP necessary for dissolving by heating to 80° C. and adding NMP so as to be able to be applied to the polyimide substrate, in case of gelatinization of the solution.

TABLE 8

| Concentration (%) | Dissolution quantity (g) | Solution state | Solubility | Plating ability |
|---|---|---|---|---|
| 5.0 | 0.05 | Aggregation | Dissolved with 4 g | ○ |
| 1.0 | 0.01 | Aggregation | Dissolved with 2 g | ○ |

COMPARATIVE EXAMPLE 1

Operations similar to the Embodiment 1 were performed without UV irradiation.

COMPARATIVE EXAMPLE 2

Operations similar to the Embodiment 2 were performed without UV irradiation.

COMPARATIVE EXAMPLE 3

Operations similar to the Embodiment 7 were performed without UV irradiation.

COMPARATIVE EXAMPLE 4

Operations similar to the Embodiment 11 were performed without UV irradiation.

COMPARATIVE EXAMPLE 5

Operations similar to the Embodiment 1 were performed except that UV irradiation was performed in the air without blocking air by a water film.

COMPARATIVE EXAMPLE 6

Operations similar to the Embodiment 1 were performed without imidation through heating.

COMPARATIVE EXAMPLE 7

Operations similar to the Embodiment 3 were performed without imidation through heating.

Results of Comparative examples 1 to 7 are shown in Table 9. As shown in the Comparative examples, the plating metal primer layer was not formed by electroless plating, because palladium ion was not completely reduced to palladium metal, in case where ultraviolet rays were not irradiated or were irradiated without the presence of hydrogen donor. In addition, in case of not executing the imidation through heating, the adhesion strength between the metal layer and the polyimide resin layer of the laminates for electronic components (electrolytic copper plating thickness 24 μm) was low, because nuclei for primer plating existing in the polyimide resin precursor layer was not caught sufficiently.

TABLE 9

| Comparative example No. | Electroless plating | Electrolytic plating | Peel strength |
|---|---|---|---|
| 1 | X | X | — |
| 2 | X | X | — |
| 3 | X | X | — |
| 4 | Δ (irregular) | X | — |
| 5 | Δ (irregular) | X | — |
| 6 | ○ | ○ | 0.3 N/cm |
| 7 | ○ | ○ | 0.25 N/cm |

The symbol "—" for the peel strength meant that the plating did not deposit completely and the peel strength could not be measured.

COMPARATIVE EXAMPLE 8

The results of the examination of solution concentration variation, using copper (II) acetylacetone complex, in place of palladium acetylacetone complex, in the Embodiment 12, are shown in Table 10. In this case, no viscosity change nor gelatinization had been observed, and the viscosity did not changed even when 24 hours had elapsed. In short, it is supposed that the complex formation does not occur when copper (II) acetylacetone complex is used.

In this table, the concentration means the concentration % of copper (II) acetylacetone complex per vanish solution and the dissolution quantity is the dissolution quantity of copper (II) acetylacetone complex.

TABLE 8

| Concentration (%) | Dissolution quantity (g) | NMP quantity (g) | Solution state |
|---|---|---|---|
| 1.0 | 0.01 | 3.0 | Liquid |
| 0.5 | 0.005 | 3.0 | Liquid |
| 0.1 | 0.001 | 3.0 | Liquid |

INDUSTRIAL APPLICABILITY

As the present invention is a polyimide resin precursor solution, in which palladium compound is dispersed uniformly in the polyimide resin precursor, and palladium compound and polyimide resin precursor form a complex, a homogenous polyimide resin precursor layer can be provided.

In addition, as the present invention is composed to have a polyimide resin layer formed with said polyimide resin precursor solution between the polyimide substrate and the surface plating layer, laminates for electronic components presenting an extremely high adhesion strength between the plating metal primer layer and the polyimide resin can be provided.

Moreover, as the present invention comprises steps of applying and drying a polyimide resin precursor solution containing a palladium compound on a polyimide substrate to form a polyimide resin precursor layer, irradiating with ultraviolet rays thereon in the presence of a hydrogen donor to form nuclei for primer plating, and thereafter, forming a plating metal primer layer by electroless plating, and further converting the polyimide resin precursor layer into a polyimide resin layer through imidation by heating it either after or before the formation of a surface plating player, the nuclei for primer plating exist in the polyimide resin, and because of the anchor effect thereof, laminates for electronic components presenting an extremely high adhesion strength between the plating metal primer layer and the polyimide resin can be provided.

What is claimed is:

1. A process for the production of a laminate, said process comprising
    forming on a polyimide substrate a polyimide resin precursor layer by coating and drying a polyimide resin precursor solution in which a palladium compound is uniformly dispersed in a polyimede resin precursor and said palladium compound and said polyimide resin precursor together form a complex;
    forming nuclei for primer plating by subjecting the polyimide resin precursor layer to ultraviolet irradiation in the presence of a hydrogen donor, and then
    forming a metal primer layer on the nuclei for primer plating through electroless plating treatment; and further forming a surface plating layer on the metal primer layer;
    wherein before or after the surface plating layer is formed, the polyimide resin precursor layer is subjected to imidation by heating and is made into a polyimide resin layer.

2. The process as claimed in claim 1, wherein the polyimide resin precursor is a polyimide resin precursor varnish comprising at least one member selected from the group consisting of polyamic acid and polyamic acid derivatives.

3. The process as claimed in claim 1, wherein the palladium compound comprises a palladium acetylacetone complex or a palladium organic acid salt.

4. The process as claimed in claim 1, wherein the hydrogen donor comprises water, alcohol or an aqueous alcohol solution.

* * * * *